United States Patent
Kim et al.

(10) Patent No.: US 12,243,844 B2
(45) Date of Patent: Mar. 4, 2025

(54) DISPLAY DEVICE AND METHOD OF MANUFACTURING THE SAME

(71) Applicant: Samsung Display Co., Ltd., Yongin-si (KR)

(72) Inventors: Byoungyong Kim, Seoul (KR); Daehyuk Im, Hwaseong-si (KR); Seung-Soo Ryu, Hwaseong-si (KR); Heeju Woo, Suwon-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 360 days.

(21) Appl. No.: 17/717,567

(22) Filed: Apr. 11, 2022

(65) Prior Publication Data
US 2022/0399299 A1 Dec. 15, 2022

(30) Foreign Application Priority Data
Jun. 9, 2021 (KR) .................. 10-2021-0075043

(51) Int. Cl.
*H05K 1/18* (2006.01)
*H01L 23/00* (2006.01)
(Continued)

(52) U.S. Cl.
CPC .............. *H01L 24/29* (2013.01); *H01L 24/05* (2013.01); *H01L 24/27* (2013.01); *H01L 24/32* (2013.01); *H01L 24/83* (2013.01); *H01R 4/04* (2013.01); *H01R 12/62* (2013.01); *H05K 1/189* (2013.01); *H05K 3/361* (2013.01); *H01L 25/18* (2013.01); *H01L 2224/05082* (2013.01);
(Continued)

(58) Field of Classification Search
CPC ................................ H01L 24/29; H05K 1/189
See application file for complete search history.

(56) References Cited

U.S. PATENT DOCUMENTS

| 6,888,497 B2 | 5/2005 | King et al. |
| 9,716,085 B2 | 7/2017 | Li et al. |
| 2019/0229446 A1* | 7/2019 | Kim .................. H05K 1/147 |

FOREIGN PATENT DOCUMENTS

| KR | 10-2014-0128155 | * 11/2014 | ................ C09J 7/02 |
| KR | 1020180000038 A | 1/2018 | |

OTHER PUBLICATIONS

Hwang et al., Machine translation of KO10-2014-0128155, 2014 (Year: 2014).*

* cited by examiner

*Primary Examiner* — Jeremy C Norris
(74) *Attorney, Agent, or Firm* — CANTOR COLBURN LLP

(57) ABSTRACT

A display device includes a substrate including a display area and a pad area, a plurality of pad electrodes disposed in the pad area on the substrate, a circuit board disposed to overlap at least a portion of the pad area on the substrate, and an anisotropic conductive layer disposed in the pad area between the substrate and the circuit board. The circuit board includes a base substrate and a plurality of bump electrodes disposed on a lower surface of the base substrate. The anisotropic conductive layer includes an adhesive layer and a plurality of conductive particles arranged in the adhesive layer. Each of the conductive particles includes a core, a first conductive film disposed on the core in a way such that at least a portion of the core is exposed, and a second conductive film entirely covering the core and the first conductive film.

19 Claims, 6 Drawing Sheets

(51) Int. Cl.
  *H01R 4/04* (2006.01)
  *H01R 12/62* (2011.01)
  *H05K 3/36* (2006.01)
  *H01L 25/18* (2023.01)

(52) U.S. Cl.
  CPC .............. *H01L 2224/05139* (2013.01); *H01L 2224/05186* (2013.01); *H01L 2224/05573* (2013.01); *H01L 2224/05624* (2013.01); *H01L 2224/05639* (2013.01); *H01L 2224/05644* (2013.01); *H01L 2224/05647* (2013.01); *H01L 2224/05686* (2013.01); *H01L 2224/27001* (2013.01); *H01L 2224/2712* (2013.01); *H01L 2224/27418* (2013.01); *H01L 2224/27436* (2013.01); *H01L 2224/29006* (2013.01); *H01L 2224/2929* (2013.01); *H01L 2224/2939* (2013.01); *H01L 2224/29411* (2013.01); *H01L 2224/29418* (2013.01); *H01L 2224/29424* (2013.01); *H01L 2224/29439* (2013.01); *H01L 2224/29444* (2013.01); *H01L 2224/29447* (2013.01); *H01L 2224/29455* (2013.01); *H01L 2224/29457* (2013.01); *H01L 2224/2946* (2013.01); *H01L 2224/29471* (2013.01); *H01L 2224/32013* (2013.01); *H01L 2224/32148* (2013.01); *H01L 2224/83005* (2013.01); *H01L 2224/83143* (2013.01); *H01L 2224/83203* (2013.01); *H01L 2924/0549* (2013.01); *H05K 2201/10128* (2013.01); *H05K 2203/104* (2013.01)

DISPLAY DEVICE AND METHOD OF MANUFACTURING THE SAME

This application claims priority to Korean Patent Application No. 10-2021-0075043, filed on Jun. 9, 2021, and all the benefits accruing therefrom under 35 U.S.C. § 119, the content of which in its entirety is herein incorporated by reference.

BACKGROUND

1. Field

Embodiments relate generally to a display device and a method of manufacturing the display device. More particularly, embodiments relate to a display device that provides visual information and a method of manufacturing the display device.

2. Description of the Related Art

A display device used in computers, televisions ("TV"s), mobile phones, etc. typically include a display panel such as a plasma display panel ("PDP"), an organic light emitting display ("OLED") panel, a liquid crystal display ("LCD") panel, a quantum dot display panel.

Such a display panel included in a display device may receive a scan signal, a data signal, etc. from an external device to display an image. In the display device, the display panel and the external device may be connected through a circuit board (e.g., a flexible film). In such a display device, the circuit board may be connected to the display panel through an anisotropic conductive film ("ACF").

SUMMARY

Embodiment provides a display device having reduced defect.

Embodiment provides a method of manufacturing the display device.

An embodiment of a display device according to the invention includes a substrate including a display area and a pad area, a plurality of pad electrodes disposed in the pad area on the substrate, a circuit board disposed to overlap at least a portion of the pad area on the substrate, and an anisotropic conductive layer disposed in the pad area between the substrate and the circuit board. In such an embodiment, the circuit board includes a base substrate and a plurality of bump electrodes disposed on a lower surface of the base substrate, and the anisotropic conductive layer includes an adhesive layer and a plurality of conductive particles arranged in the adhesive layer. In such an embodiment, each of the conductive particles includes a core, a first conductive film disposed on the core in a way such that at least a portion of the core is exposed, and a second conductive film entirely covering the core and the first conductive film.

In an embodiment, the first conductive film may face the substrate, and an exposed portion of the core may face the circuit board.

In an embodiment, each of the first conductive film and the second conductive film may include a magnetic material.

In an embodiment, the first conductive film may include at least one selected from nickel (Ni), cobalt (Co), and iron (Fe), and the second conductive film includes gold (Au).

In an embodiment, each of the core and the adhesive layer may include an insulating polymer.

In an embodiment, each of the conductive particles may have a spherical shape.

In an embodiment, the conductive particles may be arranged to be spaced apart from each other, and the conductive particles do not overlap each other in a direction from the substrate to the circuit board.

In an embodiment, the first conductive film may be disposed in a way such that a half portion of the core is exposed.

In an embodiment, the display device may further include a display portion disposed in the display area on the substrate and an encapsulation layer disposed on the display portion.

In an embodiment, the conductive particles may include first conductive particles overlapping each of the pad electrodes and each of the bump electrodes and second conductive particles other than the first conductive particles.

In an embodiment, a first surface of each of the first conductive particles may be in contact with each of the pad electrodes, and a second surface of each of the first conductive particles may be in contact with each of the bump electrodes.

An embodiment of a method of manufacturing a display device according to the invention includes: providing a magnetic member including a magnetic body; positioning a substrate including a display area and a pad area on the magnetic member, wherein a plurality of pad electrodes are attached to the substrate in the pad area; preparing an anisotropic conductive film including an uncured adhesive layer and a plurality of conductive particles arranged in the uncured adhesive layer; disposing the anisotropic conductive film in the pad area on the substrate; applying at least one of heat and pressure to the anisotropic conductive film; positioning a circuit board including a base substrate and a plurality of bump electrodes provided on a lower surface of the base substrate to overlap at least a portion of the pad area on the substrate; and attaching the pad electrodes and the bump electrodes to each other through the anisotropic conductive film.

In an embodiment, when the at least one of heat and pressure to the anisotropic conductive film is applied, the conductive particles may be arranged to be spaced apart from each other due to magnetism of the magnetic member and the conductive particles do not overlap each other in a direction from the substrate to the circuit board.

In an embodiment, the magnetic member may include at least one selected from nickel (Ni), cobalt (Co), and iron (Fe).

In an embodiment, the preparing the anisotropic conductive film may include providing a mother plate in which a plurality of holes formed; arranging a plurality of polymer particles in the holes, respectively, forming the conductive particles by coating exposed portions of each of the polymer particles and applying the uncured adhesive layer to the conductive particles arranged in the holes.

In an embodiment, each of the conductive particles may include a core, a first conductive film disposed on the core in a way such that at least a portion of the core is exposed and a second conductive film entirely covering the core and the first conductive film.

In an embodiment, the first conductive film may be disposed in a way such that a half portion of the core is exposed.

In an embodiment, the first conductive film may face the substrate, and an exposed portion of the core may face the circuit board.

In an embodiment, the first conductive film may include at least one selected from nickel (Ni), cobalt (Co), and iron (Fe), and the second conductive film includes gold (Au).

In an embodiment, each of the core and the uncured adhesive layer may include an insulating polymer.

In embodiment of the display device according to the invention, a conductive layer of each of conductive particles of an anisotropic conductive layer may be disposed in a way such that at least a portion of the core is exposed. In such embodiments, the conductive particles may be arranged to be spaced apart from each other. Accordingly, in the manufacturing process of the display device, a short defect or an open defect of the display device may be effectively prevented.

In embodiments of a method of manufacturing the display device according to the invention, a magnetic member including a magnetic material may be provided during the manufacturing process of the display device. Accordingly, in the manufacturing process of the display device, a short defect or an open defect of the display device may be effectively prevented.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
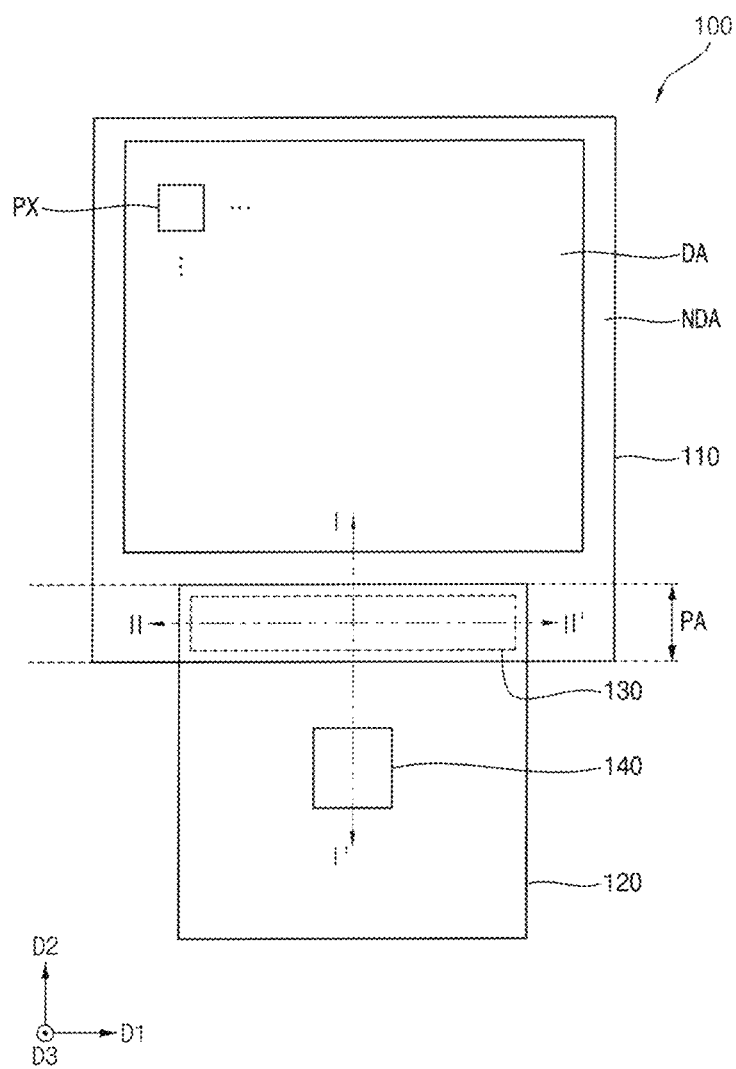
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings. Same or like reference numerals refer to same or like elements in the drawings, and repetitive detailed descriptions of the same or like elements will be omitted or simplified.

Figure 2:
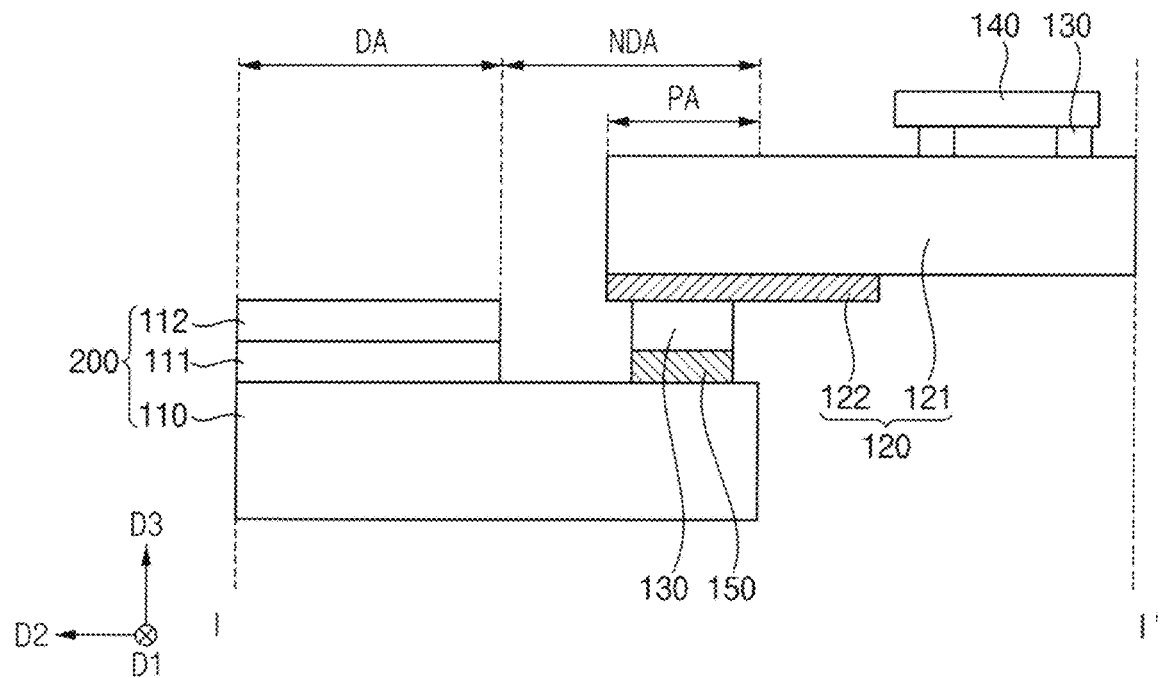
FIG. 2 is a cross-sectional view taken along line I-I' of FIG. 1.

FIG. 1 is a plan view illustrating a display device according to an embodiment. FIG. 2 is a cross-sectional view taken along line I-I' of FIG. 1, and FIG. 3 is a cross-sectional view taken along line II-II' of FIG. 1.

Figure 3:
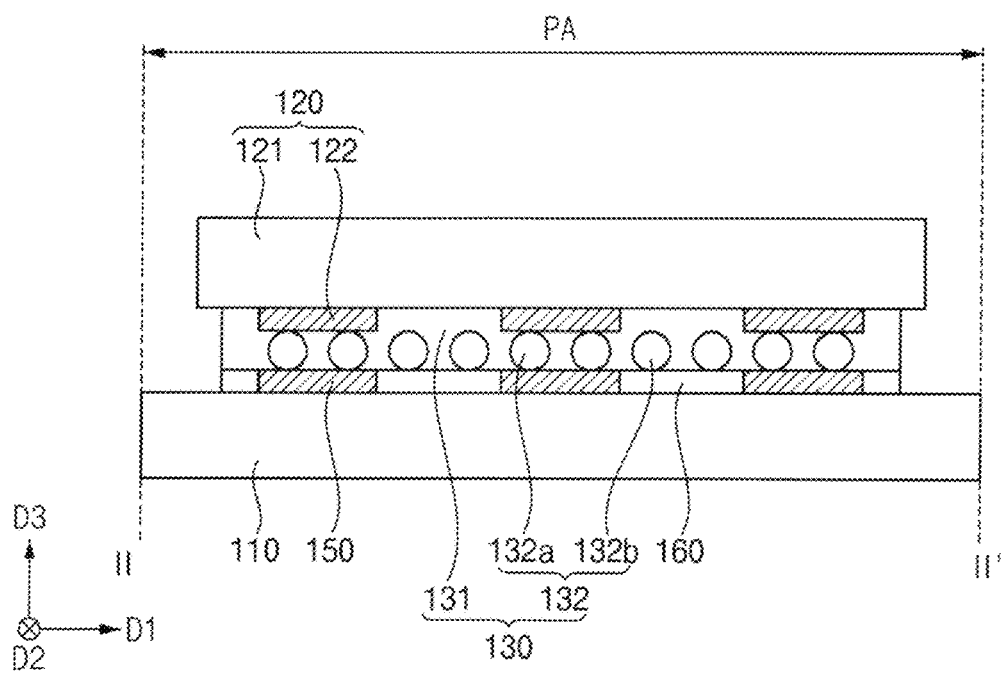
FIG. 3 is a cross-sectional view taken along line II-II' of FIG. 1.

Referring to FIGS. 1, 2, and 3, an embodiment of the display device 100 may include a display panel 200, a circuit board 120, an anisotropic conductive layer 130, a driving chip 140, a plurality of pad electrodes 150, an insulating layer 160, and the like.

In an embodiment, as shown in FIG. 2, the display panel 200 may include a substrate 110, a display portion 111, and an encapsulation layer 112. The substrate 110 may include a display area DA and a non-display area NDA. The non-display area NDA may surround at least a portion of the display area DA. In an embodiment, for example, the non-display area NDA may entirely surround the display area DA. The display area DA may be defined as an area on which an image is displayed by generating light or adjusting transmittance of light provided from an external light source. The non-display area NDA may be defined as an area that does not display an image.

The non-display area NDA may include a pad area PA. The pad area PA may have a shape extending along one side of the display device 100. In an embodiment, for example, the pad area PA may have a shape extending in a first direction D1.

Drivers may be disposed in the non-display area NDA. In an embodiment, for example, the drivers may include a gate driver for generating a gate signal, a data driver for generating a data signal, and the like.

Pixels PX each including an emission element and a driving element may be disposed in the display area DA on the substrate 110. The pixels PX may generate light based on a driving signal. Signal lines for providing a gate signal, a data signal, and the like to the pixels PX, and power lines for providing power to the pixels PX may be disposed in the display area DA. The pixels PX may be arranged in the display area DA in a matrix form. The pixels PX may be defined in the display portion 111 of the display panel 200 shown in FIG. 2.

The circuit board 120 may be disposed on the substrate 110. At least a portion of the circuit board 120 may overlap the pad area PA. In an embodiment, for example, a first portion of the circuit board 120 may overlap the pad area PA, and a second portion of the circuit board 120 may not overlap the pad area PA.

The anisotropic conductive layer 130 may be disposed in the pad area PA between the substrate 110 and the circuit board 120. The anisotropic conductive layer 130 may electrically connect the substrate 110 and the circuit board 120 to each other. The anisotropic conductive layer 130 may have a length extending in the first direction D1. The anisotropic conductive layer 130 will be described later in great detail.

The driving chip 140 may be disposed on the circuit board 120. The driving chip 140 may control signals, voltages, and the like provided to the pixels PX. The driving chip 140 may not overlap the pad area PA. In an embodiment, the circuit board 120 may be a flexible film. In such an embodiment, the driving chip 140 may have a driving chip on film ("COF") structure disposed directly on the circuit board 120. However, the invention is not limited thereto. In one alternative embodiment, for example, where the substrate 110 includes glass, the driving chip 140 may have a chip on glass ("COG") structure directly disposed on the substrate 110. In another alternative embodiment, where the substrate 110 includes a transparent resin substrate, the driving chip 140 may have a chip on plastic ("COP") structure directly disposed on the substrate 110. In an embodiment, where the driving chip 140 has the COG structure or the COP structure, the circuit board 120 may be a flexible printed circuit board ("FPCB") or a printed circuit board ("PCB"), which will be described later.

A driving device may be bonded to the circuit board 120. The pixels PX may receive a driving signal, a control signal, a power, and the like from the driving device. In an embodiment, for example, the driving device may be the FPCB or PCB. In an embodiment, where the driving chip 140 has the COF structure, the driving device may be electrically connected to the pad electrodes 150 of the pad area PA through the circuit board 120. In an alternative embodiment, where the driving chip 140 has the COG structure or the COP structure, the driving device may be directly bonded to the substrate 110 overlapping the pad area PA.

In an embodiment, as shown in FIG. 1, the substrate 110 may have a rectangular shape on a plane (or in a plan view), the configuration of the invention is not limited thereto. In an alternative embodiment, the substrate 110 may not have a rectangular shape on a plane. In an embodiment, for example, a width in the first direction D1 of a first portion of the substrate 110 overlapping the pad area PA may be smaller than a width in the first direction D1 of a second portion of the substrate 110 not overlapping the pad area PA.

In an embodiment, where the substrate 110 includes a transparent resin substrate, the substrate 110 may be bent. In such an embodiment, the circuit board 120 may not be bent. Specifically, the substrate 110 may bent in a way such that the first portion of the substrate 110 is positioned below the second portion of the substrate 110. Alternatively, where the substrate 110 includes glass, the circuit board 120 may be bent. In such an embodiment, the circuit board 120 may be bent to be disposed under the substrate 110. However, the invention is not limited thereto.

In an embodiment, the display device 100 may be an organic light emitting display ("OLED") device, but the configuration of the invention is not limited thereto. In an alternative embodiment, the display device 100 may be a liquid crystal display ("LCD") device, a field emission display ("FED") device, a plasma display panel ("PDP") device, an electrophoretic image display ("EPD") device, or a quantum dot display device.

Referring to FIGS. 1, 2, and 3, as described above, an embodiment of the display device 100 may include the display panel 200, the circuit board 120, the anisotropic conductive layer 130, the driving chip 140, the plurality of pad electrodes 150, the insulating layer 160, and the like. In such an embodiment, the display panel 200 may include the substrate 110, the display portion 111, and the encapsulation layer 112. In such an embodiment, the circuit board 120 may include a base substrate 121 and a plurality of bump electrode 122. In such an embodiment, the anisotropic conductive layer 130 may include an adhesive layer 131 and a plurality of conductive particles 132.

The substrate 110 may include a transparent or opaque material. In an embodiment, the substrate 110 may include or be formed of a transparent resin substrate. In such an embodiment, the transparent resin substrate may be a polyimide substrate. In such an embodiment, the polyimide substrate may include a first polyimide layer, a barrier film layer, a second polyimide layer, and the like. In an alternative embodiment, the substrate 110 may include a quartz substrate, a synthetic quartz substrate, a calcium fluoride substrate, a fluorine-doped quartz substrate, a sodalime glass substrate, a non-alkali glass substrate, or the like. These may be used alone or in combination with each other. However, materials of the substrate 110 are not limited thereto, and the substrate 110 may include at least one selected from other transparent materials or other opaque materials.

The display portion 111 may be disposed in the display area DA on the substrate 110. In an embodiment, as described above, the pixels PX may be defined in the display portion 111. In such an embodiment, the display portion 111 may generate an image. The encapsulation layer 112 may be disposed on the display portion 111. The encapsulation layer 112 may protect the display portion 111. The encapsulation layer 112 may be entirely disposed in the display area DA and the non-display area NDA.

The plurality of pad electrodes 150 may be disposed in the pad area PA on the substrate 110. In an embodiment, the plurality of pad electrodes 150 may be attached to an upper surface of the substrate 110 in the pad area PA. In an embodiment, as shown in FIG. 3, the plurality of pad electrodes 150 may be disposed to be spaced apart from each other in the first direction D1. In such an embodiment, each of the pad electrodes 150 may have a length extending in a second direction D2 crossing the first direction D1.

Each of the pad electrodes 150 may include at least one selected from a metal, a transparent conductive material, and the like. In an embodiment, material included in each of the pad electrodes 150 may be a metal such as gold (Au), silver (Ag), aluminum (Al), copper (Cu), and the like or a transparent conductive material such as indium tin oxide ("ITO"), indium zinc oxide ("IZO"), indium zinc tin oxide ("IZTO"), and the like. These may be used alone or in combination with each other. However, materials included in each of the pad electrodes 150 are not limited thereto, and the pad electrodes 150 may include different materials from each other. In an embodiment, each of the pad electrodes 150 may have a multilayer structure including ITO/Ag/TIO.

The insulating layer 160 may be disposed on the substrate 110. The insulating layer 160 may include at least one selected from a silicon compound, a metal oxide, and the like. In an embodiment, a material included in the insulating layer 160 may be silicon oxide ($SiO_x$), silicon nitride ($SiN_x$), silicon carbide ($SiC_x$), silicon oxynitride ($SiO_xN_y$), silicon oxycarbide ($SiO_xC_y$), or the like. These may be used alone or in combination with each other. However, the material included in the insulating layer 160 are not limited thereto, and the insulating layer 160 may include at least one selected from other silicon compound.

In an embodiment, as described above, the circuit board 120 may be disposed on the substrate 110, and the circuit board 120 may include the base substrate 121 and the plurality of bump electrodes 122. The plurality of bump electrodes 122 may be disposed on a lower surface of the base substrate 121. In such an embodiment, the plurality of bump electrodes 122 may be attached to the lower surface of the base substrate 121. In an embodiment, as shown in FIG. 3, the plurality of bump electrodes 122 may be disposed to be spaced apart from each other in the first direction D1. In such an embodiment, each of the bump electrodes 122 may have a length extending in the second direction D2 crossing the first direction D1. In an embodiment, for example, each of the bump electrodes 122 may include at least one selected form copper (Cu), gold (Au), and the like. These may be used alone or in combination with each other. However, the material included in each of the bump electrodes 122 is not limited thereto, and each of the bump electrodes 122 may include at least one selected from other metal. The base substrate 121 may include plastic. In an embodiment, for example, the base substrate 121 may include polyimide, and the like.

The anisotropic conductive layer 130 may be disposed in the pad area PA between the substrate 110 and the circuit board 120. In an embodiment, the anisotropic conductive layer 130 may be disposed in the pad area PA between the plurality of pad electrodes 150 and the plurality of bump electrodes 122 of the circuit board 120. The anisotropic conductive layer 130 may bond the pad electrodes 150 and the circuit board 120. Accordingly, the substrate 110 and the circuit board 120 may be electrically connected to each other by the anisotropic conductive layer 130. In such an embodiment, the display panel 200 and the circuit board 120 may be electrically connected to each other by the anisotropic conductive layer 130.

In an embodiment, as shown in FIG. 3, the anisotropic conductive layer 130 may include the adhesive layer 131 cured by heat and the plurality of conductive particles 132 arranged or dispersed in the adhesive layer 131.

The adhesive layer 131 may include an insulating polymer. In an embodiment, a material included in the adhesive layer 131 may be an epoxy resin, an acrylic resin, a phenol resin, a melamine resin, a diallyl phthalate resin, a urea resin, a polyimide resin, a polystyrene resin, polyurethane resin, a polyethylene resin, a polyvinyl acetate resin, or the like. These may be used alone or in combination with each other. However, the material included in the adhesive layer 131 is not limited thereto, and the adhesive layer 131 may include at least one selected from other insulating polymers.

In an embodiment, the conductive particles 132 may include first conductive particles 132a overlapping each of the pad electrodes 150 and the bump electrodes 122, and second conductive particles 132b other than the first conductive particles 132a. In such an embodiment, the first conductive particles 132a may be disposed between the pad electrodes 150 and the bump electrodes 122, and the second conductive particles 132b may not be disposed between the pad electrodes 150 and the bump electrodes 122. Accordingly, the first conductive particles 132a may electrically connect the substrate 110 and the circuit board 120, and the second conductive particles 132b may not electrically connect the substrate 110 and the circuit board 120.

In an embodiment, a first surface of each of the first conductive particles 132a may be in contact with each of the pad electrodes 150. In such an embodiment, a second surface of each of the first conductive particles 132a may be in contact with each of the bump electrodes 122. The first surface may face the substrate 110 and the second surface may face the circuit board 120.

In an embodiment, each of the conductive particles 132 may have a spherical shape. Alternatively, each of the conductive particles 132 may have an elliptical shape formed from a spherical shape by being pressed by a pressure. In an embodiment, for example, each of the first conductive particles 132a may have an elliptical shape and each of the second conductive particles 132b may have a spherical shape.

The plurality of conductive particles 132 may be fixed not to flow in the cured adhesive layer 131. In an embodiment, the plurality of conductive particles 132 may not contact from each other. In such an embodiment, the plurality of conductive particles 132 may be arranged to be spaced apart from each other. In an embodiment, for example, the plurality of conductive particles 132 may be arranged to be spaced apart from each other at equal intervals. In an embodiment, the plurality of conductive particles 132 may overlap each other in the first direction D1 and the second direction D2. The plurality of conductive particles 132 may not overlap each other in a third direction D3 crossing each of the first direction D1 and the second direction D2. In such an embodiment, the plurality of conductive particles 132 may not overlap in a direction of the circuit board 120 from the substrate 110. The plurality of conductive particles 132 will be described later in greater detail.

In an embodiment, as described above, the driving chip 140 may be disposed on the circuit board 120. The anisotropic conductive layer 130 may be disposed between the driving chip 140 and the circuit board 120. The anisotropic conductive layer 130 may bond the driving chip 140 and the circuit board 120 to each other. Accordingly, the driving chip 140 and the circuit board 120 may be electrically connected to each other by the anisotropic conductive layer 130. A structure of the anisotropic conductive layer 130 disposed between the driving chip 140 and the circuit board 120 may be the same as a structure of the anisotropic conductive layer 130 shown in FIG. 3.

Figure 4:
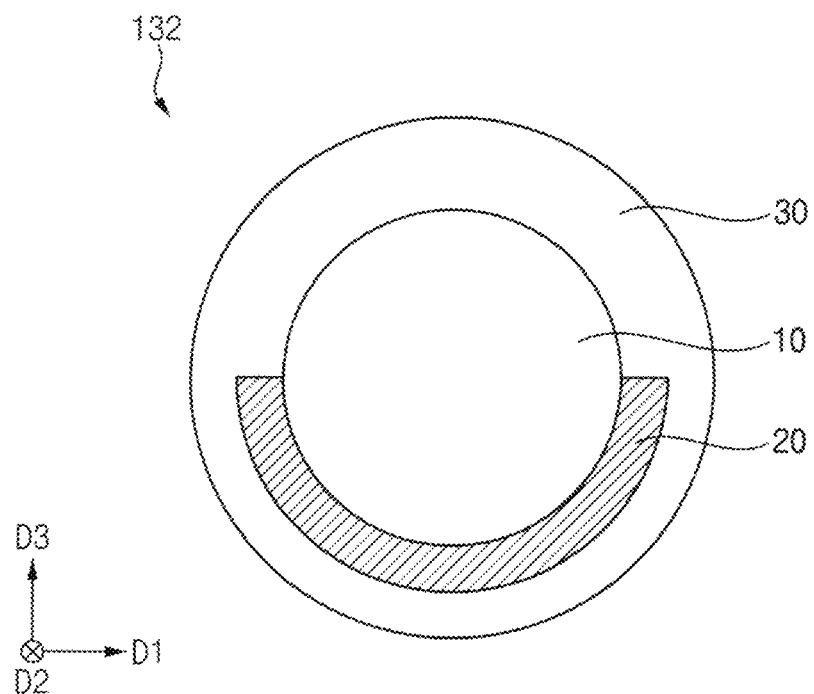
FIG. 4 is a cross-sectional view illustrating an embodiment of a conductive particle of an anisotropic conductive layer of FIG. 3.
Figure 5:
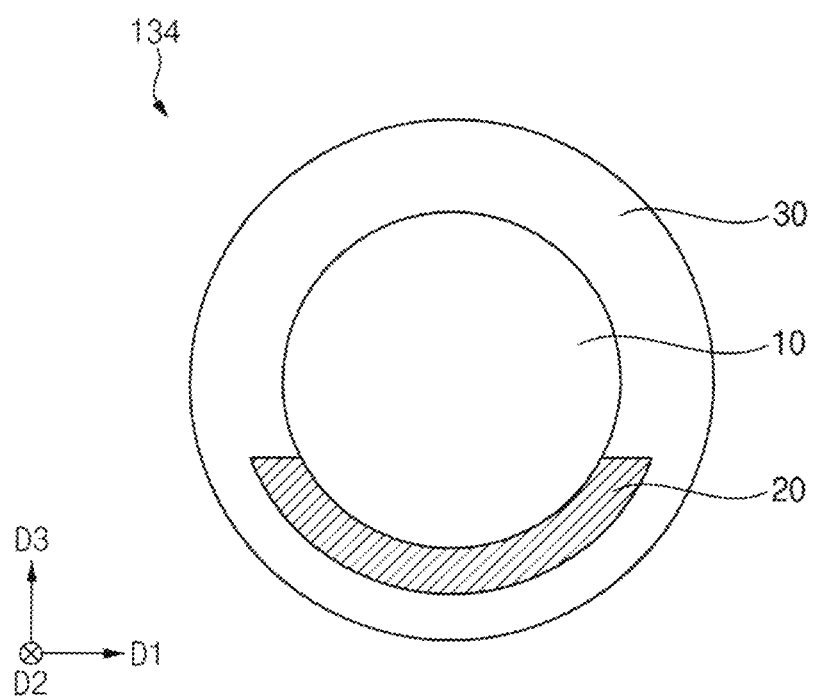
FIG. 5 is a cross-sectional view illustrating an alternative embodiment of a conductive particle of an anisotropic conductive layer of FIG. 3.

FIG. 4 is a cross-sectional view illustrating an embodiment of a conductive particle of an anisotropic conductive layer of FIG. 3. FIG. 5 is a cross-sectional view illustrating an alternative embodiment of a conductive particle of an anisotropic conductive layer of FIG. 3.

Referring to FIGS. 4 and 5, in an embodiment, each of the conductive particles 132 and 134 may include a core 10, a first conductive film 20, and a second conductive film 30.

In an embodiment, as shown in FIGS. 4 and 5, a protrusion (not shown) may not be formed or defined on a surface of each of the conductive particles 132 and 134, but the configuration of the invention is not limited thereto. In one alternative embodiment, for example, the protrusion may be formed or defined on the surface of each of the conductive particles 132 and 134.

In an embodiment, the core 10 may include an insulating polymer, In an embodiment, a material included in the core 10 may include at least one selected from an epoxy resin, an acrylic resin, a phenol resin, a melamine resin, a diallyl phthalate resin, a urea resin, a polyimide resin, a polystyrene resin, a polyurethane resin, a polyethylene resin, a polyvinyl acetate resin, and the like. These may be used alone or in combination with each other. However, materials included in the core 10 are not limited thereto, and the core 10 may include at least one selected from other insulating polymers.

In an embodiment, the first conductive film 20 may be disposed in a way such that at least a portion of the core 10 is exposed. In an embodiment, for example, as shown in FIG. 4, the first conductive film 20 may be disposed in a way such that a half portion of the core 10 is exposed. In one alternative embodiment, for example, as shown in FIG. 5, the first conductive film 20 may be disposed in a way such that at least a half portion of the core 10 is exposed. The first conductive film 20 may include a conductive metal material. In an embodiment, the first conductive film 20 may include a magnetic material. In an embodiment, for example, first conductive film 20 may include a ferromagnetic material. In an embodiment, a material included in the first conductive film 20 may include at least one selected from nickel (Ni), cobalt (Co), iron (Fe), and the like. These may be used alone or in combination with. However, materials included in the first conductive film 20 are not limited thereto, and the first conductive film 20 may include at least one selected from other metals.

In an embodiment, the first conductive film 20 may face the substrate 110, and the exposed portion of the core 10 may face the circuit board 120. In such an embodiment, the first conductive film 20 may toward the substrate 110, and the exposed portion of the core 10 may toward the circuit board 120. In such an embodiment, the first conductive film 20 may toward a direction opposite to the third direction D3, and the exposed portion of the core 10 may toward the third direction D3 (see FIGS. 3, 4, and 5).

In an embodiment, the second conductive film 30 may entirely cover the core 10 and the first conductive film 20. In such an embodiment, the second conductive film 30 may entirely cover the exposed portion of the core 10 and the first conductive film 20. The second conductive film 30 may include a conductive metal material. The second conductive film 30 may include a magnetic material. In an embodiment, a material included in the second conductive film 30 may include at least one selected from nickel (Ni), cobalt (Co), iron (Fe), copper (Cu), aluminum (Al), tin (Sn), zinc (Zn), chromium (Cr), silver (Ag), gold (Au), and the like. These may be used alone or in combination with each other. However, materials that can be included in the second conductive film 30 are not limited thereto, and the second conductive film 30 may include at least one selected from other metals.

In a conventional display device, a first conductive film of each of conductive particles of an anisotropic conductive layer is disposed to entirely cover a core. In such a conventional display device, in the process of applying heat and pressure to the anisotropic conductive film, a shape in which the conductive particles aggregated was generated due to magnetism of each of the conductive particles. Accordingly, during the manufacturing process of the display device, a short defect may occur between the adjacent electrodes due to the conductive particles concentrated on a side surface of electrodes, or an open defect may occur because the conductive particles are not properly disposed between the electrodes.

In an embodiment of the display device 100 according to the invention, the first conductive film 20 of each of the conductive particles 132 of the anisotropic conductive layer 130 may be disposed in a way such that at least a portion of the core 10 is exposed. In such an embodiment, the plurality of conductive particles 132 may be arranged to be spaced apart from each other. Accordingly, in such an embodiment, a short defect or an open defect of the display device 100 may be effectively prevented in the manufacturing process of the display device 100.

Figure 6:
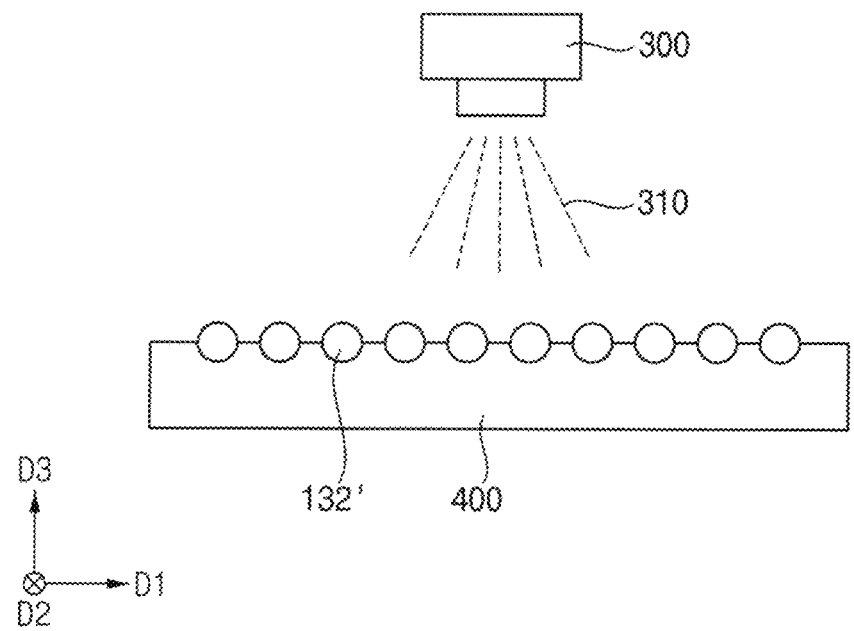
FIGS. 6, 7, 8, 9, and 10 are cross-sectional views illustrating a method of manufacturing a display device according to an embodiment.
Figure 7:
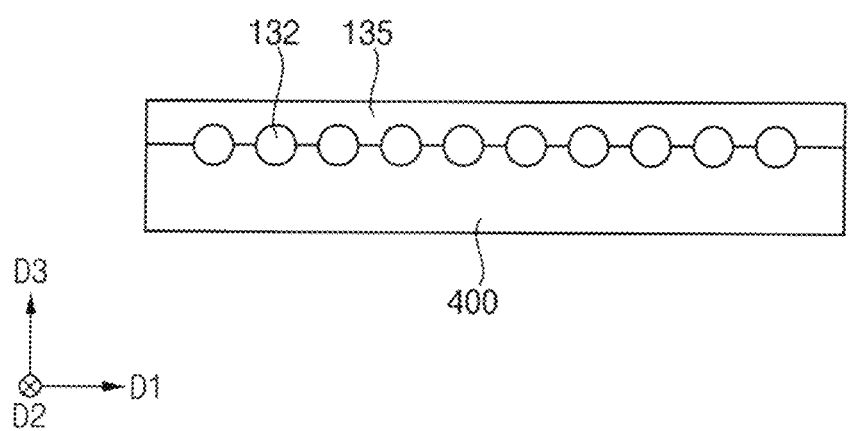
Figure 8:
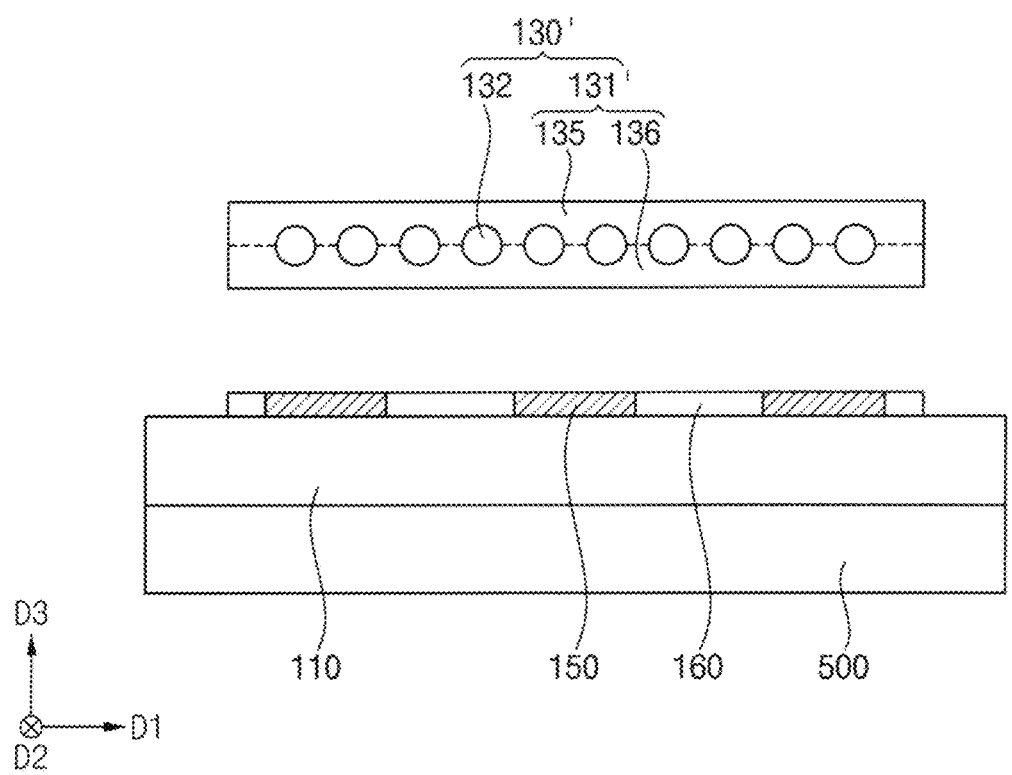
Figure 9:
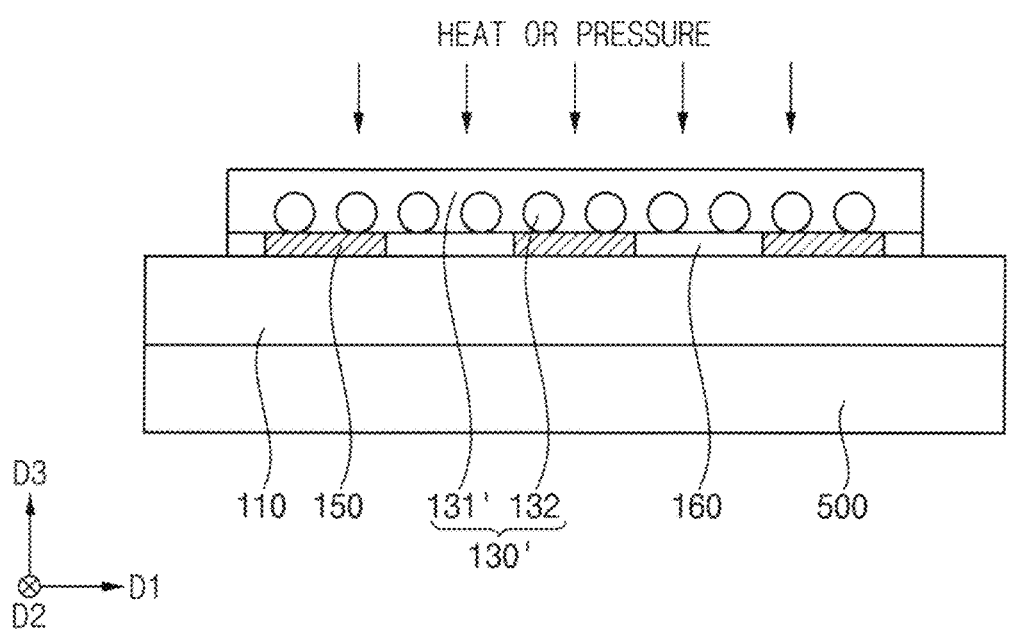
Figure 10:
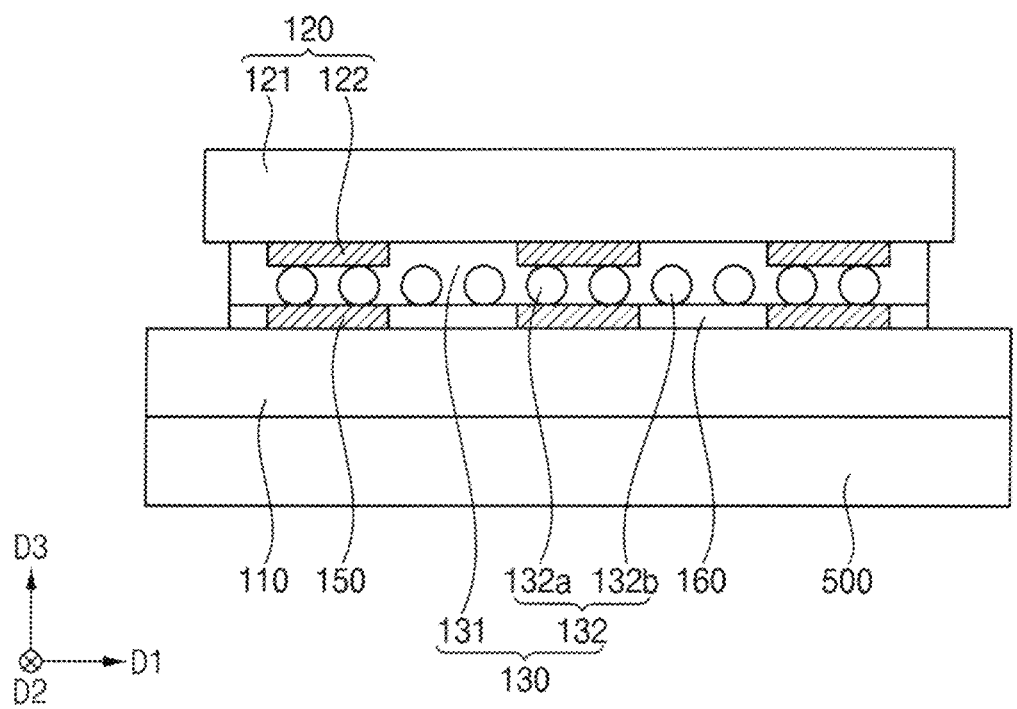

FIGS. 6, 7, 8, 9, and 10 are cross-sectional views illustrating a method of manufacturing a display device according to an embodiment. Particularly, FIGS. 6 and 7 are cross-sectional views illustrating processes of an embodiment of a method of manufacturing the anisotropic conductive film 130'. In addition, FIGS. 8, 9, and 10 are cross-sectional views illustrating the pad area PA of the display device 100.

Referring to FIG. 6, a mother plate 400 in which a plurality of holes (not shown) are formed may be provided. In an embodiment, the holes may be formed to be spaced apart from each other on an upper surface of the mother plate 400. In an embodiment, for example, the holes may be formed to be spaced apart from each other with constant intervals on the upper surface of the mother plate 400.

The plurality of polymer particles 132' may be arranged in each of the holes. In an embodiment, the plurality of polymer particles 132' may be positioned in each of the holes. Each of the polymer particles 132' may include an insulating polymer. In an embodiment, each of the polymer particles 132' may correspond to the core 10 of each of the conductive particles 132 (see FIGS. 4 and 5).

Then, the exposed portion of each of the polymer particles 132' may be coated by a spraying method through a spraying apparatus 300. The spraying apparatus 300 may spray a conductive metal material 310. The conductive metal material 310 may include at least one selected from nickel, cobalt, iron, and the like. In such an embodiment, the conductive metal material 310 may correspond to the first conductive film 20 of each of the conductive particles 132 (see FIGS. 4 and 5). In such an embodiment, only the exposed portion of each of the polymer particles 132' may be coated with the conductive metal material 310. However, the invention is not limited thereto, and the plurality of polymer particles 132' may be coated in other ways.

After the exposed portion of each of the polymer particles 132' is coated with a conductive metal material 310, the polymer particles 132' may be removed or detached from the mother plate 400, and each of the polymer particles 132' may be plated or coated with a metal. In an embodiment, for example, the metal may include at least one selected from nickel, cobalt, iron gold, and the like. In an embodiment, the metal may include gold. In such an embodiment, the metal may correspond to the second conductive film 30 of each of the conductive particles 132 (see FIGS. 4 and 5).

Accordingly, the plurality of conductive particles 132 each including the core 10, the first conductive film 20, and the second conductive film 30 may be formed. After the plurality of conductive particles 132 are formed, the plurality of conductive particles 132 may re-positioned in the holes of the mother plate 400.

Referring to FIGS. 7 and 8, a first uncured adhesive layer 135 may be applied to the arranged conductive particles 132. In an embodiment, the first uncured adhesive layer 135 may be applied to the conductive particles 132 to cover an upper surface of each of the conductive particles 132. Next, the conductive particles 132 and the first uncured adhesive layer 135 may be removed from the mother plate 400, and a second uncured adhesive layer 136 may be applied to the conductive particles 132 to cover a lower surface of each of the conductive particles 132. An uncured adhesive layer 131' entirely covering the conductive particles 132 may be formed through or defined by the first uncured adhesive layer 135 and the second uncured adhesive layer 136. The uncured adhesive layer 131' may include an insulating polymer. In an embodiment, a material included in the uncured adhesive layer 131' may include at least one selected from an epoxy resin, an acrylic resin, a phenol resin, and the like. These may be used alone or in combination with each other.

Accordingly, the anisotropic conductive film 130' including the uncured adhesive layer 131' and the conductive particles 132 may be formed. The mother plate 400 is used only to manufacture the anisotropic conductive film 130'. Hereinafter, a method of electrically connecting the substrate 110 and the circuit board 120 using the anisotropic conductive film 130' will be described.

Referring to FIG. 8, as shown in FIGS. 6 and 7, the anisotropic conductive film 130' including the uncured adhesive layer 131' and the conductive particles 132 arranged in the uncured adhesive layer 131' may be prepared.

In an embodiment, a magnetic member 500 including a magnetic material may be provided. In an embodiment, for example, the magnetic member 500 may include a ferromagnetic material. In such an embodiment, a material included in the magnetic member 500 may include at least one selected from Ni, Co, Fe, and the like. These may be used alone or in combination with each other. However, materials included in the magnetic member 500 are not limited thereto, and the magnetic member 500 may include at least one selected from other magnetic materials. In an embodiment, a material included in the magnetic member 500 and a material included in the first conductive film 20 of each of the conductive particles 132 may be the same as each other (see FIGS. 4 and 5).

The substrate 110 may be positioned on the magnetic member 500. The substrate 110 may include a transparent or opaque material. The substrate 110 may include or be formed of a transparent resin substrate. In an embodiment, for example, the transparent resin substrate used to form the substrate 110 may be polyimide.

The plurality of pad electrodes 150 may be provided or formed on the substrate 110. In an embodiment, the plurality of pad electrodes 150 may be attached to the upper surface of the substrate 110 in the pad area PA. The pad electrodes 150 may be formed to be spaced apart from each other in the first direction D1. In an embodiment, for example, each of the pad electrodes 150 may include at least one selected from ITO, IZO, IZTO, and the like. These may be used alone or in combination with each other.

The insulating layer 160 may be provided or formed on the substrate 110. The insulating layer 160 may include at least one selected from a silicon compound, a metal oxide, and the like.

In an embodiment, referring back to FIG. 2, an electronic component including the display panel 200, the plurality of pad electrodes 150, and the insulating layer 160 may be positioned on the magnetic member 500. In such an embodiment, after the electronic component is first manufactured, the electronic component may be positioned on the magnetic member 500.

Referring to FIG. 9, the anisotropic conductive film 130' may be disposed on the pad area PA on the substrate 110. In an embodiment, the anisotropic conductive film 130' may be disposed on the plurality of pad electrodes 150 and the insulating layer 160. In such an embodiment, the anisotropic conductive film 130' may be in contact with the plurality of pad electrodes 150 and the insulating layer 160.

In an embodiment, at least one of heat and pressure (i.e., heat and/or pressure) may be applied to the anisotropic conductive film 130'. In such an embodiment, heat or pressure may be applied to the anisotropic conductive film 130' so that the anisotropic conductive film 130' is attached to the plurality of pad electrodes 150. In such an embodiment, the uncured adhesive layer 131' of the anisotropic conductive film 130' may be cured to form the adhesive layer 131. Accordingly, the anisotropic conductive layer 130 including the adhesive layer 131 and the plurality of conductive particles 132 arranged in the adhesive layer 131 may be formed.

In a process of applying at least one of heat and pressure to the anisotropic conductive film 130', the conductive particles 132 may be arranged to be spaced apart from each other due to the magnetism of the magnetic member 500. In the process of applying at least one of heat and pressure to the anisotropic conductive film 130', the conductive particles 132 may not overlap each other in the third direction D3 due to the magnetism of the magnetic member 500. That is, the conductive particles 132 may not overlap each other in a direction from the circuit board 120 from the substrate 110. Accordingly, in the manufacturing process of the display device 100, a short defect or an open defect of the display device 100 may be effectively prevented.

Referring to FIG. 10, the circuit board 120 may be provided on the substrate 110 to overlap at least a portion of the pad area PA. In an embodiment, the circuit board 120 may be positioned on the anisotropic conductive layer 130 to overlap at least a portion of the pad area PA. The circuit board 120 may be in contact with the anisotropic conductive layer 130.

The circuit board 120 may include a base substrate 121 and the plurality of bump electrodes 122 formed on the lower surface of the base substrate 121. The base substrate 121 may include polyimide, or the like. Each of the bump electrodes 122 may include at least one selected from Cu, Au, and the like. These may be used alone or in combination with each other.

After the circuit board 120 is in contact with the anisotropic conductive layer 130, at least one of heat and pressure may be applied to the circuit board 120 to electrically connect the substrate 110 and the circuit board 120.

In the process of applying at least one of heat and pressure to the circuit board 120, the plurality of first conductive particles 132a among the conductive particles 132 may be disposed between the plurality of pad electrodes 150 and the plurality of bump electrodes 122, and the plurality of second conductive particles 132b among the conductive particles 132 may not be disposed between the plurality of pad electrodes 150 and the plurality of bump electrodes 122. In such an embodiment, the plurality of pad electrodes 150 and the plurality of bump electrodes 122 may be attached through the plurality of first conductive particles 132a and may not be attached through the plurality of second conductive particles 132b. In such an embodiment, the plurality of pad electrodes 150 and the plurality of bump electrodes 122 may be attached through the anisotropic conductive layer 130. Accordingly, the substrate 110 and the circuit board 120 may be electrically connected to each other through the anisotropic conductive layer 130.

After the circuit board 120 is electrically connected to the substrate 110 through the anisotropic conductive layer 130, the magnetic member 500 may be removed. In such an embodiment, the display device 100 may not include the magnetic member 500.

Accordingly, the display device 100 shown in FIG. 3 may be manufactured.

Embodiments of the invention may be applied to a display device and an electronic device including the display device. Embodiments of the invention may be applied to high-resolution smartphones, mobile phones, smart pads, smart watches, tablet personal computers ("PC"s), vehicle navigation systems, televisions, computer monitors, notebook computers, and the like, for example.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a substrate including a display area and a pad area;
a plurality of pad electrodes disposed in the pad area on the substrate;
a circuit board disposed to overlap at least a portion of the pad area on the substrate, wherein the circuit board includes a base substrate and a plurality of bump electrodes disposed on a lower surface of the base substrate; and
an anisotropic conductive layer disposed in the pad area between the substrate and the circuit board, wherein the anisotropic conductive layer includes an adhesive layer and a plurality of conductive particles arranged in the adhesive layer,
wherein each of the conductive particles includes a core, a first conductive film disposed on the core in a way such that at least a portion of the core is exposed, and a second conductive film entirely covering the core and the first conductive film, and
wherein the first conductive film is a single conductive film continuously extending in a way such that a half portion or at least a half portion of the core is exposed.

2. The display device of claim 1, wherein
the first conductive film faces the substrate, and
an exposed portion of the core faces the circuit board.

3. The display device of claim 1, wherein each of the first conductive film and the second conductive film includes a magnetic material.

4. The display device of claim 1, wherein
the first conductive film includes at least one selected from nickel (Ni), cobalt (Co), and iron (Fe), and
the second conductive film includes gold (Au).

5. The display device of claim 1, wherein each of the core and the adhesive layer includes an insulating polymer.

6. The display device of claim 1, wherein each of the conductive particles has a spherical shape.

7. The display device of claim 1, wherein
the conductive particles are arranged to be spaced apart from each other, and
the conductive particles do not overlap each other in a direction from the substrate to the circuit board.

8. The display device of claim 1, further comprising:
a display portion disposed in the display area on the substrate; and
an encapsulation layer disposed on the display portion.

9. The display device of claim 1, wherein the conductive particles includes:
first conductive particles overlapping each of the pad electrodes and each of the bump electrodes; and
second conductive particles other than the first conductive particles.

10. The display device of claim 9, wherein a first surface of each of the first conductive particles is in contact with each of the pad electrodes and a second surface of each of the first conductive particles is in contact with each of the bump electrodes.

11. A method of manufacturing a display device, the method comprising:
providing a magnetic member including a magnetic body;
positioning a substrate including a display area and a pad area on the magnetic member, wherein a plurality of pad electrodes are attached to the substrate in the pad area;
preparing an anisotropic conductive film including an uncured adhesive layer and a plurality of conductive particles arranged in the uncured adhesive layer;
disposing the anisotropic conductive film in the pad area on the substrate;
applying at least one of heat and pressure to the anisotropic conductive film;

positioning a circuit board including a base substrate and a plurality of bump electrodes provided on a lower surface of the base substrate to overlap at least a portion of the pad area on the substrate; and attaching the pad electrodes and the bump electrodes to each other through the anisotropic conductive film.

12. The method of claim 11, wherein, when the at least one of heat and pressure to the anisotropic conductive film is applied, the conductive particles are arranged to be spaced apart from each other due to magnetism of the magnetic member, and the conductive particles do not overlap each other in a direction from the substrate to the circuit board.

13. The method of claim 11, wherein the magnetic member includes at least one selected from nickel (Ni), cobalt (Co), and iron (Fe).

14. The method of claim 11, wherein the preparing the anisotropic conductive film includes:

providing a mother plate in which a plurality of holes formed;

arranging a plurality of polymer particles in the holes, respectively;

forming the conductive particles by coating exposed portions of each of the polymer particles; and applying the uncured adhesive layer to the conductive particles arranged in the holes.

15. The method of claim 11, wherein each of the conductive particles includes:

a core;

a first conductive film disposed on the core in a way such that at least a portion of the core is exposed; and a second conductive film entirely covering the core and the first conductive film.

16. The method of claim 15, wherein the first conductive film is disposed in a way such that a half portion of the core is exposed.

17. The method of claim 15, wherein the first conductive film faces the substrate, and an exposed portion of the core faces the circuit board.

18. The method of claim 15, wherein the first conductive film includes at least one selected from nickel (Ni), cobalt (Co), and iron (Fe), and the second conductive film includes gold (Au).

19. The method of claim 15, wherein each of the core and the uncured adhesive layer includes an insulating polymer.

* * * * *